United States Patent [19]

Reimer

[11] 3,780,798

[45] Dec. 25, 1973

[54] AIR DIRECTING HEAT SINK MOUNTING OF ELECTRICAL COMPONENTS

[75] Inventor: William A. Reimer, Wheaton, Ill.

[73] Assignee: GTE Automatic Electric Laboratories Incorporated, Northlake, Ill.

[22] Filed: Oct. 30, 1972

[21] Appl. No.: 301,903

[52] U.S. Cl. .................... 165/128, 62/418, 98/40 R, 317/100

[51] Int. Cl. .................... H02b 1/00

[58] Field of Search .................... 165/47, 80, 128; 62/418; 98/40 R; 317/100

[56] References Cited

UNITED STATES PATENTS 3,730,264 10/1971 Krylow et al. .................... 165/128

*Primary Examiner*—Charles Sukalo
*Attorney*—K. Mullerheim et al.

[57] ABSTRACT

Electronic component mounting heat sink members for printed wiring cards have heat dissipating fins oriented with respect to the free convection air flow such as to direct heated air out of the equipment in which the components are used.

4 Claims, 2 Drawing Figures

AIR DIRECTING HEAT SINK MOUNTING OF ELECTRICAL COMPONENTS

FIELD OF THE INVENTION

The present invention relates most generally to the field of heat exchange and more particularly to a new and improved air directing heat sink mounting for electrical components.

DESCRIPTION OF THE PRIOR ART

Many electronic systems include high power dissipation components and the printed wiring cards on which components that dissipate large quantities of heat are mounted can be severely limited in the electronic packaging density that may be achieved. Typical of this problem is the electronic power supply in which power dissipation is high for the volume occupied and wherein a number of supplies are commonly positioned one above another in racks such that the heat dissipated in a vertical column of supplies is additive.

Prior to the present invention a wide variety of heat dissipating arrangements have been devised including directed forced convection cooling as illustrated in U.S. Pat. No. 3,592,260 as well as many heat dissipator geometries as typified by U.S. Pat. No. 3,187,812. The primary disadvantage of forced cooling of large electronic systems is the requirement of fans which not only require operating power but alos constitute additional failure points in the system and serve to increase system costs. The shortcoming of the prior art heat dissipators used in electronic systems which are cooled only by free convection air flow is that the heated air is typically not directed out of the system with any high degree of efficiency.

OBJECTS AND SUMMARY OF THE INVENTION

From the preceding discussion it will be understood that among the various objectives of the present invention are included the following:

the provision of a new and novel heat sink for mounting electrical components;

the provision of apparatus of the above described character which directs the air flow through the equipment in which it is employed; and the provision of apparatus of the above-described character having improved efficiency in managing free convection air flow.

These and other objectives of the present invention are efficiently achieved by providing a first or primary inclined heat sink for directing heated air from the front of a wiring card file and a secondary inclined heat sink for directing heated air toward the first heat sink. The foregoing as well as other objects, features and advantages of the present invention will become more apparent from the following detailed description taken in conjunction with the appended drawings.

DESCRIPTION OF THE PREFERRED EMBODIMENT

Figure 1:
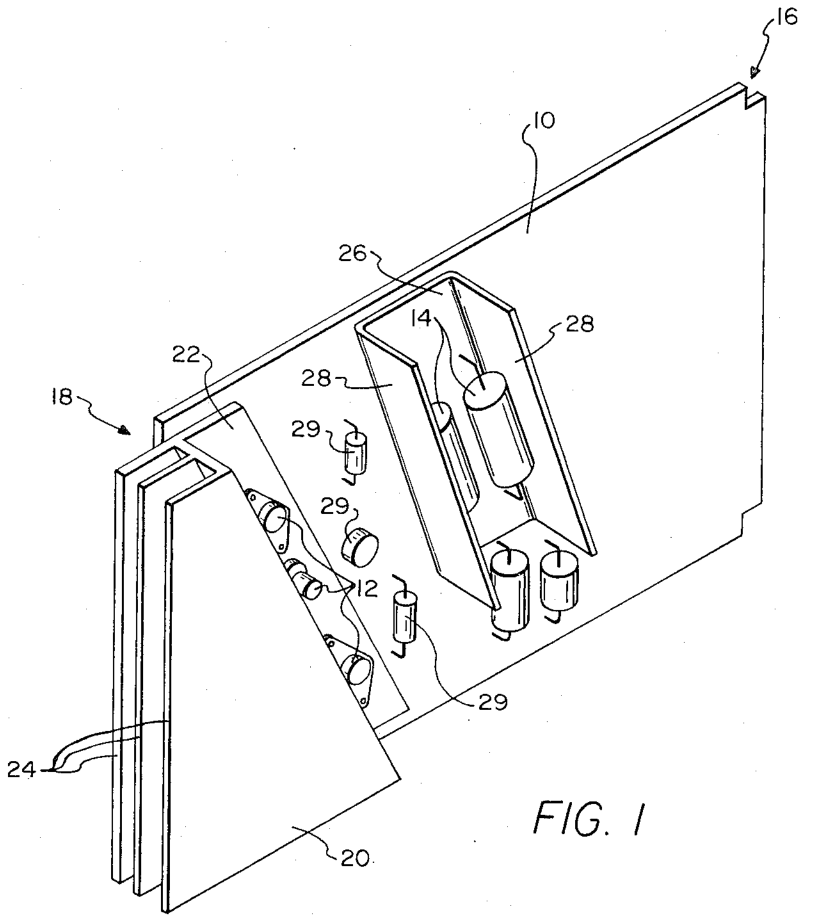
FIG. 1 is an elevation view of a printed wiring card provided with an air directing heat sink arrangement in accordance with the principles of the present invention.

Turning now to FIG. 1 there is illustrated a printed wiring card 10 having a plurality of electrical components including primary heat dissipating devices 12 such as power transistors and the like and secondary heat dissipating elements 14 such as resistors. The wiring card 10 is adapted at one end 16 for insertion into a suitable electrical connector (not shown) and the other or handle end 18 is typically provided with some convenient type of insertion/ extraction means (not shown).

In the practice of the present invention the handle end 18 of wiring card 10 is provided with a first or primary heat sink 20 having a root area 22 and a plurality of outwardly extending fins 24. The primary heat dissipating electrical components 12 are mounted in a conductive heat transfer relationship to the root area 22 of the primary heat sink 20. The primary heat sink root area 22 is mounted to the printed wiring card 10 at an angle such that heated air rising by convection through the fins 24 is directed outwardly from the wiring card and mixes with the ambient air. With this arrangement the effective length of the fins for a given projection from the handle 18 of the printed wiring card 10 is maximized and heated air rising through the fins is prevented from reentering the equipment.

The secondary heat dissipating components 14 are mounted in a conductive heat transfer relationship to a secondary heat sink 26. This secondary heat sink 26 is also mounted to the printed wiring card 10 and includes fins 28 which extend outwardly from the surface of the printed wiring card 10, and which are oriented at an angle of inclination with respect to vertical such as to direct the heated air rising across the surface of printed wiring card 10 toward the handle end 18. In this manner the heated air is directed from the interior of the electronic equipment such that it eventually is exhausted by the primary heat sink 20. The angle of inclination and position of the secondary heat sink 26 are selected to direct the air flow without significantly impeding it and to minimize the number of vertically adjacent wiring cards through which the air passes before being exhausted.

Both the primary and secondary heat sinks, 20 and 26 respectively, are preferred to extend from the surface of the printed wiring card 10 a distance comparable to the maximum allowable electrical component height in order that power is dissipated across the entire space between laterally adjacent cards and to efficiently direct the air flow.

Any remaining electrical components 29 which are of a minor heat dissipating character are preferred to be mounted to the printed wiring card 10 in the area intermediate the primary and secondary heat sinks such that any heat dissipated thereby will also be carried out of the equipment by the directed air flow. By mounting few or no electrical components on the portion of the printed wiring card 10 adjacent the connector end 16 a cool air intake channel is provided.

Figure 2:
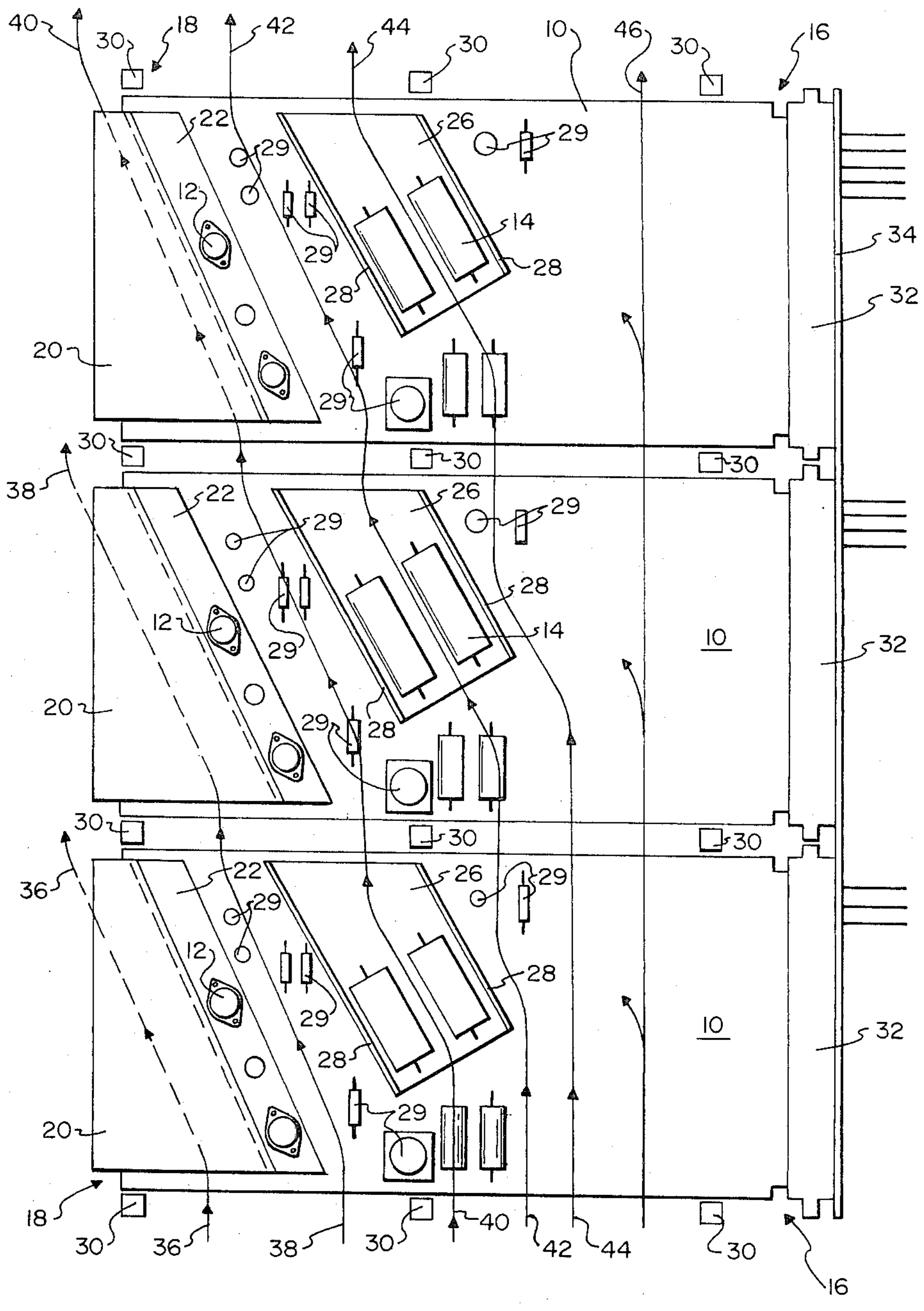
FIG. 2 is a side view of a plurality of printed wiring cards of the type illustrated in FIG. 1 and including an indication of the convection air flow management provided by the structure of the present invention.

FIG. 2 is a side view illustration of a plurality of vertically adjacent printed wiring cards provided with the air directing heat sink arrangement of the present invention and wherein elements common to those shown in FIG. 1 are identified by common reference characters.

The printed wiring cards 10 are mounted in conventional fashion in a card file including supporting cross members 30 and are inserted in connectors 32 which are affixed to a solid ground plane 34. The free convection air currents through the structure of the invention are indicated by flow lines 36–46. Cool air (e.g. flow line 46) is drawn into the equipment at the rear portion of the wiring cards 10 adjacent the connector end 16. The heat dissipated by the secondary heat dissipating components 14 produces a convection current (e.g. flow line 40) through the lowermost secondary heat sink 26 which is directed forwardly in the direction of the primary heat sink 20. This air current continues to flow upwardly over the minor heat dissipating elements 29 disposed intermediate the primary and secondary heat sinks 20 and 26 on the middle wiring card 10 and is finally exhausted from the equipment by the primary heat sink 20 of the uppermost wiring card 10 to mix with the ambient air.

Although the embodiment of the present invention illustrated in FIGS. 1 and 2 include a single secondary heat sink it will be apparent that for printed wiring cards of large size a plurality may be employed in both vertically and horizontally arranged positions on the cards.

From the preceding description it will be seen that the Applicant has provided a new and novel air directing heat sink mounting arrangement for electrical components whereby the objectives set forth hereinabove are efficiently met. Since certain changes in the above-described construction will occur to those skilled in the art without departure from the scope of the invention it is intended that all matter contained in the above description or shown in the appended drawings shall be interpreted as illustrative and not in a limiting sense.

Having described what is new and novel and desired to secure by Letters Patent, what is claimed is:

1. In combination with a printed wiring card having primary and secondary heat dissipating electrical components coupled thereto, an air directing heat sink means comprising a primary heat sink having a root area mounted to one end of said printed wiring card, adapted for mounting said primary heat dissipating electrical components in a conductive heat transfer relationship therewith, and having a plurality of heat exchanging fins oriented at an angle of inclination with respect to and extending from said end of said printed wiring card; and a secondary heat sink mounted on said printed wiring card at a laterally spaced apart position with respect to said primary heat sink, adapted for mounting said secondary heat dissipating electrical components in a conductive heat transfer relationship therewith, and having heat exchanging fins extending from the surface of said printed wiring card at an angle of inclination with respect to vertical whereby air heated by said secondary heat dissipating electrical components is directed by the heat exchanging fins of said secondary heat sink in a lateral direction toward said primary heat sink, and air heated by heat dissipated from said primary heat dissipating electrical components is directed by said primary heat sink outwardly from said printed wiring card.

2. Apparatus as recited in claim 1 wherein the outer edges of the heat exchanging fins of said primary heat sink are substantially parallel with the end of said printed wiring card such that said fins are relatively wider at the lower end than at the upper end thereof and the effective length thereof is maximized with respect to the distance said heat exchange fins extend from said printed wiring card.

3. Apparatus as recited in claim 1 wherein said heated air rises over the surface of said printed wiring card by free convection.

4. Apparatus as recited in claim 1 including a plurality of vertically adjacent printed wiring cards each provided with a primary heat sink and a secondary heat sink and wherein the spatial relationship of said secondary heat sink with respect to said primary heat sink is such that said secondary heat sink disposed on a first printed wiring card directs air heated by said secondary heat dissipating electrical components toward the primary heat sink of the next higher vertically adjacent printed wiring card.

* * * * *